US 9,733,134 B2

(12) United States Patent
Hugo et al.

(10) Patent No.: US 9,733,134 B2
(45) Date of Patent: Aug. 15, 2017

(54) SOLDER ASSEMBLY TEMPERATURE MONITORING PROCESS

(71) Applicant: International Business Machines Corporation, Armonk, NY (US)

(72) Inventors: Stephen Michael Hugo, Stewartville, MN (US); Matthew Stephen Kelly, Markham (CA)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/862,954

(22) Filed: Sep. 23, 2015

(65) Prior Publication Data

US 2016/0011061 A1    Jan. 14, 2016

Related U.S. Application Data

(63) Continuation of application No. 13/739,994, filed on Jan. 11, 2013.

(51) Int. Cl.
*H02H 5/04* (2006.01)
*G01K 13/00* (2006.01)
(Continued)

(52) U.S. Cl.
CPC .............. *G01K 13/00* (2013.01); *B23K 1/008* (2013.01); *B23K 1/0016* (2013.01); *B23K 1/015* (2013.01);
(Continued)

(58) Field of Classification Search
CPC ...... G01K 13/00; B23K 1/0016; B23K 1/008; B23K 1/015; H05K 3/34; H05K 13/0465;
(Continued)

(56) References Cited

U.S. PATENT DOCUMENTS 3,922,917 A    12/1975    Ayres
4,170,956 A *  10/1979    Wear ..................... G01K 11/06
                                                    116/206

(Continued)

FOREIGN PATENT DOCUMENTS

DE    10116172      10/2002
JP    02276286      11/1990
JP    2006073283     3/2006

OTHER PUBLICATIONS

Non-Reversible Tempature Indicators, http://www.data-acquisition.us/industrial_electronics/input_devices_sensors_transducers_transmitters_measurement/Non-reversible_Temperature_Indicators.html, last retrieved: Jan. 9, 2013.

(Continued)

*Primary Examiner* — Danny Nguyen
(74) *Attorney, Agent, or Firm* — Kunzler Law Group

(57) ABSTRACT

A method includes providing a printed circuit board ("PCB") supporting a solderable component, and supporting a first fuse on the PCB, where the first fuse includes a first temperature-sensitive element that measurably changes in response to exposure to ambient thermal conditions exceeding a first threshold temperature. The PCB, the solderable component, and the first fuse define an apparatus. The method includes performing a PCB assembly manufacturing process, and then testing the first fuse to determine whether, during the PCB assembly manufacturing process, the first fuse was exposed to ambient thermal conditions exceeding a first threshold temperature. The first threshold temperature is a minimum temperature where the PCB assembly manufacturing process is to be carried out, a maximum temperature at which the PCB assembly manufacturing process is to occur, or a first intermediate temperature between the minimum and maximum temperatures.

6 Claims, 7 Drawing Sheets

(51) Int. Cl.
  *H05K 13/04* (2006.01)
  *H05K 13/08* (2006.01)
  *B23K 1/00* (2006.01)
  *B23K 1/008* (2006.01)
  *B23K 1/015* (2006.01)
  *H05K 3/34* (2006.01)
  *G01K 3/00* (2006.01)

(52) U.S. Cl.
  CPC ........... *H05K 3/34* (2013.01); *H05K 13/0465* (2013.01); *H05K 13/08* (2013.01); *G01K 3/005* (2013.01); *H05K 2203/04* (2013.01); *H05K 2203/162* (2013.01)

(58) Field of Classification Search
  CPC ............... H05K 13/08; H05K 2203/04; H05K 2203/162
  USPC .......................................... 361/104, 103, 106
  See application file for complete search history.

(56) References Cited

U.S. PATENT DOCUMENTS

| | | | |
|---|---|---|---|
| 4,344,061 A | 8/1982 | Niwa | |
| 4,769,902 A | 9/1988 | Mehta et al. | |
| 5,274,351 A | 12/1993 | Lee et al. | |
| 6,373,371 B1 | 4/2002 | Doerrwaechter et al. | |
| 6,402,372 B1 | 6/2002 | Saunders | |
| 6,616,332 B1 | 9/2003 | Renken et al. | |
| 6,734,781 B1 | 5/2004 | Nagashima | |
| 6,769,294 B2 | 8/2004 | Yurjevich et al. | |
| 7,604,400 B2 | 10/2009 | Thompson et al. | |
| 7,815,370 B2 | 10/2010 | Simon, III et al. | |
| 7,920,044 B2 | 4/2011 | Scheiber et al. | |
| 2003/0158683 A1 | 8/2003 | Gauthier et al. | |
| 2005/0133855 A1* | 6/2005 | Graf | H01L 23/34 257/327 |
| 2005/0179516 A1 | 8/2005 | Yoshikawa | |
| 2007/0258298 A1 | 11/2007 | Amidon et al. | |
| 2008/0285253 A1 | 11/2008 | Scheiber et al. | |
| 2009/0020588 A1* | 1/2009 | Saito | B23K 1/0008 228/103 |
| 2009/0285258 A1 | 11/2009 | Kinami | |
| 2011/0024964 A1 | 2/2011 | Goodman et al. | |
| 2014/0198424 A1 | 7/2014 | Hugo et al. | |

OTHER PUBLICATIONS

Markal, High Performance Industrial Markers—Temperature Indicators—THERMOMELT, http://www.markal.com/temperature-indicators/thermomelt/, © 2013 LA-CO Industries, Inc., All rights reserved. Last retrieved: Jan. 10, 2013.

Markai & LA-CO Industries, Inc., Temperature Indicators Product Detail—Thermomelt, © 2008 LA-CO Industries, Inc., All Rights Reserved; 2008.

RD 443041—"Burn in Board fuse functionality checking method involves supplying voltage to all fuses and comparing voltage drop across fuses with reference voltage to check functionality of fuses," Mar. 10, 2001.

Office Action from U.S. Appl. No. 13/739,994, filed Jan. 11, 2013, Mailed Oct. 1, 2015.

* cited by examiner

SOLDER ASSEMBLY TEMPERATURE MONITORING PROCESS

FIELD

The subject matter disclosed herein relates to printed circuit board assemblies, and more particularly relates to methods for recording the temperatures encountered by a printed circuit board assembly during manufacturing and storage.

BACKGROUND

Description of the Related Art

Many steps are used to form printed circuit board assemblies. Some of these steps require elevation of the printed circuit board assembly to certain temperatures. Specifically, a solder assembly process may be used to provide and/or connect conductive elements on the printed circuit board assembly by heating a conductive metal to a melted or liquidus temperature. The solder assembly process may be carried out in solder melting equipment such as a convection oven, vapor phase oven, or the like. The solder assembly process should be carried out at a specific temperature profile for the printed circuit board assembly being manufactured; maximum oven temperatures that are too low or too high can cause the improper formation of the desired electrical solder connections. If such a condition is not rapidly discovered during the manufacturing process, the result is significant scrap and/or rework expense as multiple bad boards are produced.

BRIEF SUMMARY

A method for recording ambient temperatures applicable to an integrated card assembly manufacturing process is disclosed. An apparatus and computer program product also perform the functions of the method. An apparatus according to the invention may include a printed circuit board, a solderable component supported by the printed circuit board, and a first fuse supported by the printed circuit board. The first fuse may include a first temperature-sensitive element that measurably changes in response to exposure of the first fuse to ambient thermal conditions exceeding a first threshold temperature. The first threshold temperature may include a minimum temperature at which a printed circuit board assembly manufacturing process used to manufacture the printed circuit board assembly is to be carried out, a maximum temperature at which the printed circuit board assembly manufacturing process is to occur, or a first intermediate temperature between the minimum and maximum temperatures.

In one embodiment, the first fuse includes a first test conductor connected to the first fuse and a second test conductor connected to the first fuse and the printed circuit board assembly includes a plurality of printed circuit board assembly test conductors. Resistance of the temperature-sensitive element measurably changes in response to exposure of the first fuse to ambient thermal conditions exceeding the first threshold temperature. The first and second test conductors and the printed circuit board assembly test conductors are positioned to receive contact from probes of an in-circuit tester that measures operation of the printed circuit board assembly and measures the resistance.

In another embodiment, the first threshold temperature includes a minimum temperature and the apparatus further includes a second fuse supported by the printed circuit board, where the second fuse includes a second temperature-sensitive element that measurably changes in response to exposure of the second fuse to ambient thermal conditions exceeding a second threshold temperature. The second threshold temperature includes a maximum temperature. In a further embodiment, the printed circuit board assembly manufacturing process includes a solder assembly process.

In one embodiment, the apparatus includes a second fuse supported by the printed circuit board, where the second fuse includes a second temperature-sensitive element that measurably changes in response to exposure of the second fuse to ambient thermal conditions exceeding a second threshold temperature, and a third fuse supported by the printed circuit board, where the third fuse includes a third temperature-sensitive element that measurably changes in response to exposure of the third fuse to ambient thermal conditions exceeding a third threshold temperature. In the embodiment, the first and second threshold temperatures are spaced apart by a temperature increment and the second and third threshold temperatures are spaced apart by the temperature increment. In another embodiment, first fuse is surface mounted to the printed circuit board.

In one embodiment, the first fuse is positioned at a first location on the printed circuit board and the apparatus also includes a second fuse supported by the printed circuit board, where the second fuse includes a second temperature-sensitive element that measurably changes in response to exposure of the second fuse to ambient thermal conditions exceeding a second threshold temperature, and where the second fuse is positioned at a second location on the printed circuit board displaced from the first fuse and the first threshold temperature is specific to the first location and the second threshold temperature is specific to the second location.

A system according to the invention may include an apparatus and a testing apparatus. The apparatus may include a printed circuit board and a solderable component supported by the printed circuit board, where the printed circuit board assembly includes a plurality of printed circuit board assembly test conductors, and a first fuse is supported by the printed circuit board. The first fuse includes a first temperature-sensitive element that measurably changes in response to exposure of the first fuse to ambient thermal conditions exceeding a first threshold temperature. The apparatus may also include a first test conductor connected to the first fuse and a second test conductor connected to the first fuse. The testing apparatus may include a first probe movable into contact with the first test conductor, a second probe movable into contact with a second test conductor, printed circuit board assembly probes movable into contact with the printed circuit board assembly test conductors, and a test module. The test module determines whether, during the printed circuit board assembly manufacturing process, the first fuse was exposed to ambient thermal conditions exceeding the first threshold temperature. In one embodiment, the test module, through the printed circuit board assembly probes, assesses operation of the printed circuit board assembly.

In one embodiment, the apparatus further includes a second fuse supported by the printed circuit board and the testing apparatus includes a third probe movable into contact with a third test conductor connected to the second fuse and a fourth probe movable into contact with a fourth test conductor connected to the second fuse. The test module also determines whether, during the printed circuit board assembly manufacturing process, the second fuse was exposed to ambient thermal conditions exceeding a second threshold temperature. In a further embodiment, the first threshold temperature includes a minimum temperature related to temperature specifications of the printed circuit board assembly manufacturing process and the second threshold temperature includes a maximum temperature related to temperature specifications of the printed circuit board assembly manufacturing process. The test module registers an error if the first fuse has not been exposed to ambient thermal conditions exceeding the minimum temperature and registers an error if the second fuse has been exposed to ambient thermal conditions exceeding the maximum temperature.

In another further embodiment, the apparatus also includes a third fuse supported by the printed circuit board, where the third fuse includes a fifth test conductor connected to the third fuse and a fourth test conductor connected to the third fuse. The testing apparatus, in the embodiment, includes a fifth probe movable into contact with the fifth test conductor and a sixth probe movable into contact with the sixth test conductor where the test module determines whether, during the printed circuit board assembly manufacturing process, the third fuse was exposed to ambient thermal conditions exceeding a third threshold temperature. In another embodiment, the first and second threshold temperatures are spaced apart by a temperature increment and the second and third threshold temperatures are spaced apart by the temperature increment. The test module further records the ambient thermal conditions to which each apparatus has been exposed and/or registers an error if a trend in the ambient thermal conditions indicates the printed circuit board assembly manufacturing process has more than an acceptable likelihood of operating outside the temperature specifications. The aforementioned trend is determined through statistical process control where many printed circuit board assemblies have their test results stored.

In another embodiment, the apparatus includes an identifier and the testing apparatus also includes a reader. The test module to cause the reader to read the identifier, store the identifier, store data regarding results of application of the first fuse test current across the first fuse, and/or link the data to the identifier.

A method according to the invention may include providing a printed circuit board, supporting an solderable component on the printed circuit board, and supporting a first fuse on the printed circuit board, where the first fuse includes a first temperature-sensitive element that measurably changes in response to exposure of the first fuse to ambient thermal conditions exceeding a first threshold temperature such that the printed circuit board, the solderable component, and the first fuse define an apparatus. The method may further include performing a printed circuit board assembly manufacturing process on the apparatus, and testing the first fuse after termination of the printed circuit board assembly manufacturing process to determine whether, during the printed circuit board assembly manufacturing process, the first fuse was exposed to ambient thermal conditions exceeding a first threshold temperature. The first threshold temperature may be a minimum temperature at which the printed circuit board assembly manufacturing process used to manufacture the printed circuit board assembly is to be carried out, a maximum temperature at which the printed circuit board assembly manufacturing process is to occur, or a first intermediate temperature between the minimum and maximum temperatures.

In one embodiment, the first fuse includes a first test conductor connected to the first fuse and a second test conductor connected to the first fuse and the printed circuit board assembly includes a plurality of printed circuit board assembly test conductors, where a resistance of the temperature-sensitive element measurably changes in response to exposure of the first fuse to ambient thermal conditions exceeding the first threshold temperature. In the embodiment, the method also includes contacting the first and second test conductors and the printed circuit board assembly test conductors with probes of an in-circuit tester, measuring resistance of the first fuse by way of the first and second conductors, and assessing operation of the printed circuit board assembly through the printed circuit board assembly test conductors.

In another embodiment, the first threshold temperature includes a minimum temperature related to temperature specifications of the printed circuit board assembly manufacturing process, the apparatus also includes a second fuse supported by the printed circuit board, and the method also includes testing the second fuse after termination of the printed circuit board assembly manufacturing process to determine whether, during the printed circuit board assembly manufacturing process, the second fuse was exposed to ambient thermal conditions exceeding a second threshold temperature including the a maximum temperature of the temperature specifications of the printed circuit board assembly manufacturing process. In a further embodiment, performing the printed circuit board assembly manufacturing process includes performing a solder assembly process on the printed circuit board assembly.

In another embodiment, the apparatus also includes a second fuse supported by the printed circuit board and a third fuse supported by the printed circuit board. In the embodiment, the method also includes testing the second fuse after termination of the printed circuit board assembly manufacturing process to determine whether, during the printed circuit board assembly manufacturing process, the second fuse was exposed to ambient thermal conditions exceeding a second threshold temperature and testing the third fuse after termination of the printed circuit board assembly manufacturing process to determine whether, during the printed circuit board assembly manufacturing process, the third fuse was exposed to ambient thermal conditions exceeding a third threshold temperature. The first and second threshold temperatures are spaced apart by a temperature increment and the second and third threshold temperatures are spaced apart by the temperature increment.

A system according to the invention may alternatively include an apparatus and a testing apparatus. The apparatus may include a printed circuit board, a solderable component supported by the printed circuit board, where the printed circuit board assembly includes a plurality of printed circuit board assembly test conductors, and a first fuse supported by the printed circuit board. The first fuse includes a first temperature-sensitive element that measurably changes in response to exposure of the first fuse to ambient thermal conditions exceeding a threshold temperature related to a minimum temperature at which a solder assembly process used to manufacture the printed circuit board assembly is to be carried out. The apparatus includes a first test conductor connected to a first end of the first fuse and a second test conductor connected to a second end of the first fuse.

The apparatus includes a second fuse supported by the printed circuit board, where the second fuse includes a second temperature-sensitive element that measurably changes in response to exposure of the second fuse to ambient thermal conditions exceeding a second threshold temperature related to a maximum temperature at which the solder assembly process is to be carried out. The apparatus includes a third test conductor connected to a first end of the second fuse and a fourth test conductor connected to a second end of the second fuse.

The testing apparatus may include a plurality of probes movable to contact the first test conductor, the second test conductor, the third test conductor, the fourth test conductor, and the printed circuit board assembly test conductors, and a test module that determines whether, during the solder assembly process, the first fuse was exposed to ambient thermal conditions exceeding the first threshold temperature, determines whether, during the printed circuit board assembly manufacturing process, the second fuse was exposed to ambient thermal conditions exceeding the second threshold temperature, and assesses, using the printed circuit board assembly probes, operation of the printed circuit board assembly. In one embodiment, the test module also registers an error if the first fuse has not been exposed to ambient thermal conditions exceeding the minimum temperature and registers an error if the second fuse has been exposed to ambient thermal conditions exceeding the maximum temperature.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION OF THE INVENTION

Figure 1:
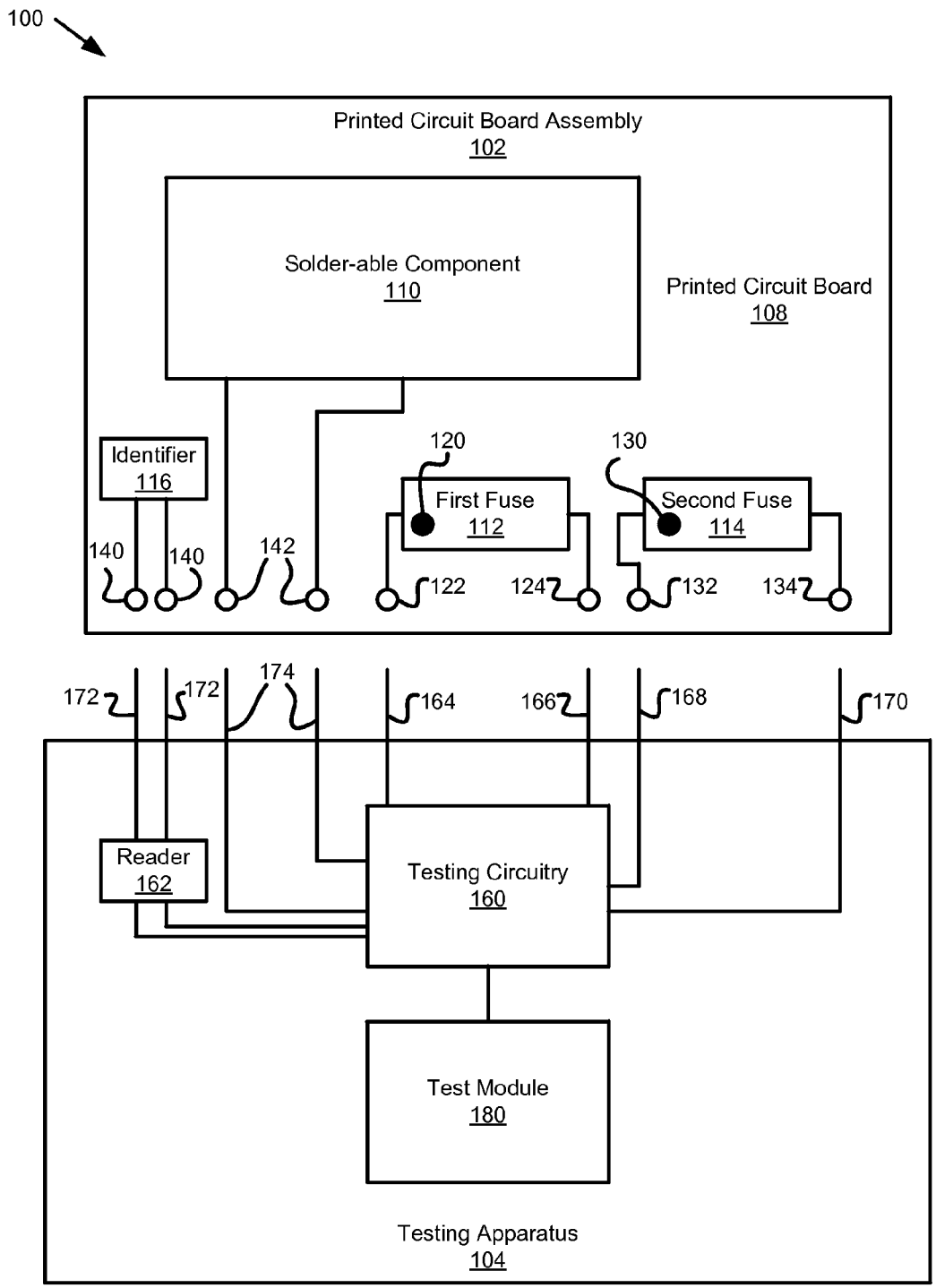
FIG. 1 is a schematic block diagram illustrating one embodiment of a system in accordance with the present invention.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system."Furthermore, aspects of the present invention may take the form of a computer program product embodied in one or more computer readable medium(s) having program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the program code may be stored and/or propagated on in one or more computer readable medium(s).

The computer readable medium may be a tangible computer readable storage medium storing the program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable storage medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store program code for use by and/or in connection with an instruction execution system, apparatus, or device.

The computer readable medium may also be a computer readable signal medium. A computer readable signal medium may include a propagated data signal with program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport program code for use by or in connection with an instruction execution system, apparatus, or device. Program code embodied on a computer readable signal medium may be transmitted using any appropriate medium, including but not limited to wire-line, optical fiber, Radio Frequency (RF), or the like, or any suitable combination of the foregoing In one embodiment, the computer readable medium may comprise a combination of one or more computer readable storage mediums and one or more computer readable signal mediums. For example, program code may be both propagated as an electro-magnetic signal through a fiber optic cable for execution by a processor and stored on RAM storage device for execution by the processor.

Program code for carrying out operations for aspects of the present invention may be written in any combination of one or more programming languages, including an object oriented programming language such as Java, Smalltalk, C++, PHP or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program product may be shared, simultaneously serving multiple customers in a flexible, automated fashion. The computer program product may be integrated into a client, server and network environment by providing for the computer program product to coexist with applications, operating systems and network operating systems software and then installing the computer program product on the clients and servers in the environment where the computer program product will function.

In one embodiment software is identified on the clients and servers including the network operating system where the computer program product will be deployed that are required by the computer program product or that work in conjunction with the computer program product. This includes the network operating system that is software that enhances a basic operating system by adding networking features.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by program code. The program code may be provided to a processor of a general purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks. The program code may also be loaded onto a computer, other programmable data processing apparatus, or other devices to cause a series of operational steps to be performed on the computer, other programmable apparatus or other devices to produce a computer implemented process such that the program code which executed on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

FIG. 1 is a schematic block diagram illustrating one embodiment of a system 100 in accordance with the present invention. The system 100 includes a printed circuit board assembly 102 and a testing apparatus 104. The testing apparatus 104 is designed to test the operation of the printed circuit board assembly 102, and is also designed to detect and record data pertaining to the printed circuit board assembly 102, the thermal conditions it has been subjected to, and whether it functions properly, as will be set forth below.

In FIG. 1, the printed circuit board assembly 102 takes the form of a printed circuit board assembly 102, and may be of a type that is mass-produced through the use of a process that has to take place within a specified temperature range. The printed circuit board assembly 102 may have a printed circuit board 108 formed of multiple conductive layers, and a solderable component 110, a first fuse 112, a second fuse 114, and an identifier 116 that are all supported by the printed circuit board 108. The solderable component 110 may made be for use in any type of electronic device.

According to one embodiment, the printed circuit board assembly 102 is produced through the use of a solder assembly process in which the printed circuit board assembly 102 is heated through the use of a heating device such as a convection oven or a vapor phase oven. The solder assembly process heats a metal, such as a solder, to a temperature sufficient to impart desired properties such as flowability, viscosity, etc. It is important that the solder assembly process be carried out within the established temperature profile so that the desired electrical connections will be made without connecting parts that are not supposed to be in electrical communication with each other. The solderable component 110 may have electrical connections that are formed, at least in part, through the use of the solder assembly process. The solderable component 110 may be very complex; accordingly, the temperature profile of the solder assembly process may need to be very tightly controlled.

The first fuse 112 has a first temperature-sensitive element 120, a first test conductor 122 connected to the first fuse 112, and a second test conductor 124 connected to the first fuse 112. The first temperature-sensitive element 120 may undergo a change when the first temperature-sensitive element 120 is placed in an environment with ambient temperatures exceeding a first threshold temperature. For example, the first temperature-sensitive element 120 may include a material that melts, crystallizes, changes phases, evaporates, or otherwise changes in a distinct, easily-measured manner. "Ambient thermal conditions" relates to the temperature of surrounding solid or fluid "ambient thermal conditions" relates to temperatures of solid or fluid matter outside but proximate to the fuse.

In the embodiment of FIG. 1, the first temperature-sensitive element 120 is a conducting material that becomes relatively non-conductive in response to exposure to ambient temperatures exceeding the threshold temperature. The material may melt at the threshold temperature to enable the increase in resistance to occur. Thus, a test current across the first and second test conductors 122, 124 will encounter a measurably higher resistance if the first fuse 112 has been exposed to ambient thermal conditions exceeding the threshold temperature.

As embodied in FIG. 1, the first temperature-sensitive element 120 changes in response to temperatures greater than the first threshold temperature. However in alternative embodiments, "ambient thermal conditions exceeding the first threshold temperature" may refer to an ambient temperature lower than the first threshold temperature. For example, some materials will change phase, change resistance, change color, etc. as temperatures decline. As some products are damaged by exposure to excessively cold temperatures, measurement of such exposure may be desirable, and may be accomplished through the use of a properly configured fuse according to the invention.

According to one alternative embodiment, the first temperature-sensitive element 120 may be a material that changes color or gloss in response to exposure to temperatures exceeding the threshold temperature. Such a material may be applied through the use of a marker like the Heat-Stik markers marketed by Markal (www.markal.com). The color change can be detected through the use of a photoelectric sensor or the like. Detection could also be done with automated optical inspection tools that are typically found in a printed circuit board assembly operation. In such an embodiment, the first and second test conductors 122, 124 would not be needed since the change in the first temperature-sensitive element 120 is measured without running a test current through the first fuse 112.

Returning to FIG. 1, the second fuse 114 may have a configuration similar to that of the first fuse 112. The second fuse 114 has a second temperature-sensitive element 130, a third test conductor 132 connected to the second fuse 114, and a fourth test conductor 134 connected to the second fuse 114. The second temperature-sensitive element 130 may be configured such that its resistance will change at a second threshold temperature different from the first threshold temperature at which the first temperature-sensitive element 120 changes. Thus, the first and second fuses 112, 114 can be used to measure whether the printed circuit board assembly 102 has been exposed to two different threshold temperatures.

The identifier 116 may be specific to each individual printed circuit board assembly 102 so that each printed circuit board assembly 102 can be properly identified. The identifier 116 may take the form of a serial number, and may identify data regarding the printed circuit board assembly 102 such as the manufacturing date, manufacturing facility, batch number, product in which the printed circuit board assembly 102 is to be used, etc. The identifier 116 may be encoded into a computer-readable memory so that it can easily be read during testing. Thus, the identifier 116 has identifier test conductors 140 that enable the testing apparatus 104 to read the serial number pertaining to each individual printed circuit board assembly 102.

In alternative embodiments, an identifier may be a visible number, bar code, or the like. Such an identifier could be read by a human or computer with the proper optical equipment. Alternatively, radio-frequency ID (RFID) tags or other devices may be used as identifiers.

As shown in FIG. 1, the printed circuit board assembly 102 is designed to be tested through the use of an in-circuit testing procedure. The solderable component 110 may have printed circuit board assembly test conductors 142 to facilitate such testing. The testing process may include reading the identifier 116, determining whether the solderable component 110 functions properly, and determining whether the first and second fuses 112, 114 have "blown" (i.e., whether the first and second temperature-sensitive elements 120, 130 have been exposed to ambient thermal conditions exceeding the first and second threshold temperatures).

The testing apparatus 104 may be an in-circuit tester such as a probe card or the like. The testing apparatus 104 may have testing circuitry 160 and a reader 162 connected to the testing circuitry 160. The testing circuitry 160 is connected to a first probe 164, a second probe 166, a third probe 168, a fourth probe 170, identifier probes 172, and printed circuit board assembly probes 174. The probes 164, 166, 168, 170, 172, 174 are positioned such that, when the testing apparatus 104 and the printed circuit board assembly 102 move together, the probes 164, 166, 168, 170, 172, 174 come into contact with the test conductors 122, 124, 132, 134, 140, 142, respectively.

With the probes 164, 166, 168, 170, 172, 174 in contact with the test conductors 122, 124, 132, 134, 140, 142, the testing circuitry 160 and the reader 162 apply test currents, signals, etc. across the test conductors 122, 124, 132, 134, 140, 142. In one embodiment, a first test current is applied across the first and second test conductors 122, 124, to determine whether the first fuse 112 has been blown. In another embodiment, resistance is measured across the first and second test conductors 122, 124 to determine a resistance of the first fuse 112. In another embodiment, a continuity check is performed across the first and second conductors 122, 124 to determine if the first fuse 112 is blown.

A second test current is applied across the third and fourth test conductors 132, 134, or other testing means, to determine whether the second fuse 114 has been blown. An identifier test is performed using the identifier test conductors 140, such as reading an identifier 116. In one embodiment, current is applied across the identifier test conductors 140 to enable the reader 162 to read the identifier 116. In another embodiment, a signal is applied and read over the identifier test conductors 140. An printed circuit board assembly test signal is applied across the printed circuit board assembly test conductors 142 to assess the operation of the solderable component 110, i.e., determine whether the solderable component 110 functions properly. This process will be set forth in greater detail in the description of FIGS. 3A and 3B.

The testing circuitry 160 delivers testing data to a test module 180. The test module 180 may also convey instructions to the testing circuitry 160. The test module 180 may be a computer, specialized printed circuit board assembly, network terminal, or other device that can receive and process data. Thus, instructions performed and/or issued by the test module 180 may be implemented in hardware, software, or in other ways known in the art.

Figure 2:
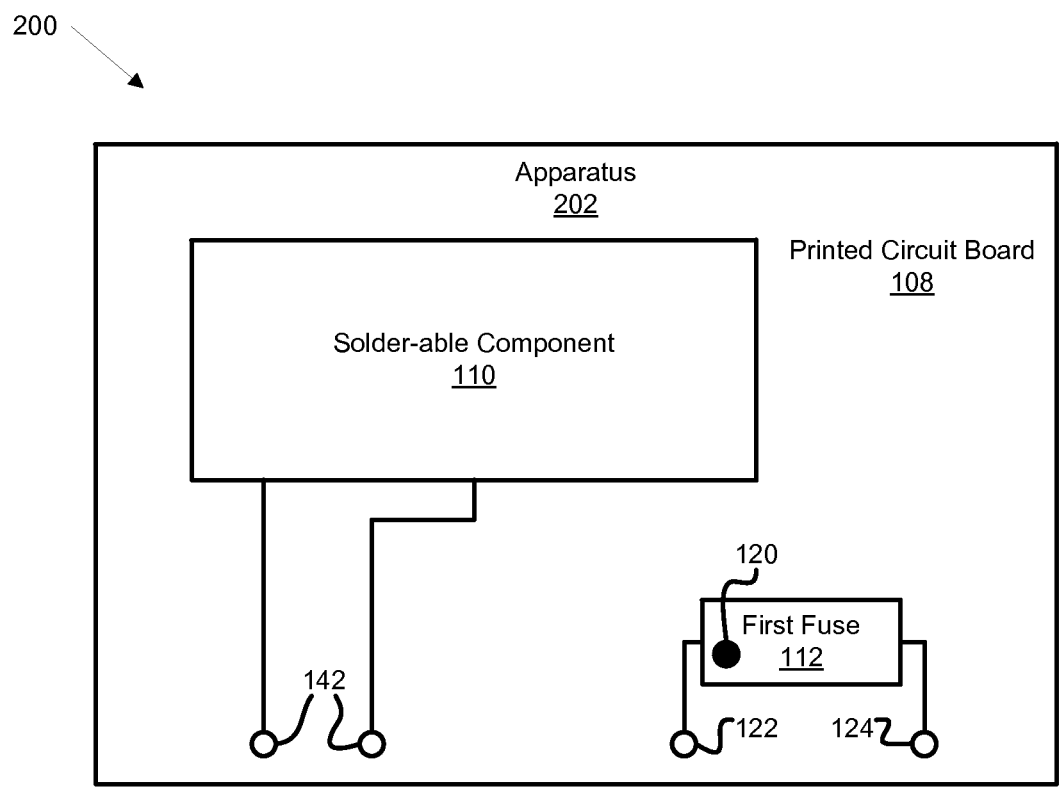
FIG. 2 is a schematic block diagram illustrating an apparatus according to one alternative embodiment of the invention.

FIG. 2 is a schematic block diagram illustrating an apparatus 200 according to one alternative embodiment of the invention. The apparatus 200 may take the form of a printed circuit board assembly 202. The printed circuit board assembly 202 is simplified compared to the printed circuit board assembly 102 because the printed circuit board assembly 202 lacks the identifier 116 and the second fuse 114. Accordingly, the apparatus 200 may have only the printed circuit board 108, the solderable component 110, and the first fuse 112. As in the printed circuit board assembly 102 depicted in FIG. 1, the first fuse 112 blows at a first threshold temperature. Thus, the first fuse 112 keeps a record of whether the printed circuit board assembly 202 has been exposed to ambient thermal conditions exceeding the first threshold temperature.

Figure 3A:
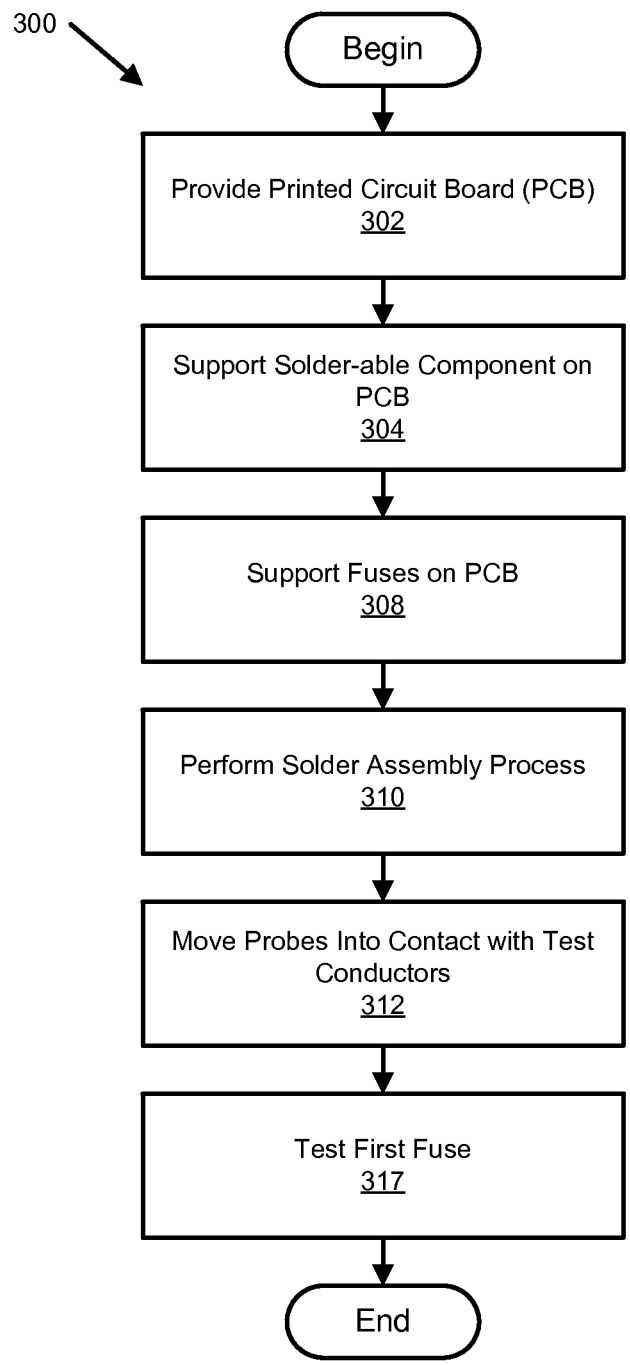
FIG. 3A is a schematic flow chart diagram illustrating one embodiment of a method for assessing adherence of a manufacturing process to temperature specifications that may be used in conjunction with the system of FIG. 1 in accordance with the present invention.

FIG. 3A is a schematic flow chart diagram illustrating one embodiment of a method 300 for assessing adherence of a manufacturing process to temperature specifications that may be used in conjunction with the system 100 of FIG. 1 in accordance with the present invention. The method 300 may begin with providing 302 the printed circuit board 108. The printed circuit board 108 may be provided with any of the methods and materials known in the printed circuit board arts. If desired, the solderable component 110, the first and second fuses 112, 114, and the identifier 116 may also be manufactured separately and provided. Then the method 300 may include supporting 304 the solderable component 110 on the printed circuit board 108 and supporting 306 the first and second fuses 112, 114 on the printed circuit board 108, for example, by securing the elements 110, 112, 114, 116 to the printed circuit board 108 with chemical or mechanical bonds or mechanical fastening devices known in the art.

Alternatively, the solderable component 110 may be formed in-situ on or within the material of the printed circuit board 108. Thus, supporting the solderable component 110 on the printed circuit board 108 may include formation of the solderable component 110. The step 304 may be accomplished through a variety of printed circuit board fabrication methods known in the art for imbedding components within the printed circuit board 108. One such example is embedded resistors or capacitors.

The first and second fuses 112, 114 may be supported 308 on or in the printed circuit board 108. The fuses 112, 114 may be pin through hole parts; accordingly, they may be provided separately and secured to the printed circuit board 108 with known chemical or mechanical adhesives or devices. The pins (not shown) of the fuses 112, 114 may be inserted through holes of the printed circuit board 108 and secured via soldering or other processes; the solder points may then serve as the test conductors 122, 124, 132, 134. Alternatively, the first and second fuses 112, 114 may be surface mounted to the printed circuit board 108. As another alternative, as with the solderable component 110, the first and second fuses 112, 114 may be formed in-situ on the printed circuit board 108, if desired.

The solder assembly process may then be performed 310. The solder assembly process may be carried out in a number of ways. In certain embodiments, the printed circuit board assembly 102 is exposed to a heat source that melts the solder or other conductive material. In one embodiment, the printed circuit board assembly 102 is inserted into a convection or vapor phase oven for a specified time, and then removed. After the printed circuit board assembly 102 has been removed from the oven and allowed to cool, the first and second probes 164, 166 may be moved 312 into contact with the first and second test conductors 122, 124 of the first fuse 112.

Once the first and second probes 164, 166 are in contact with the first and second test conductors 122, 124, the testing apparatus 104 may test 317 the first fuse 112 to determine whether it has blown. This testing step 317 may, for example, include applying a first fuse test current through the first fuse 112 via the first and second probes 164, 166 and measuring the resistance encountered. Measuring resistance, in one embodiment, does not require returning a resistance value; rather, measurement of resistance may simply entail determining whether the resistance is classified as "high" or "low." In another embodiment, measuring resistance may include determining an amount of resistance and determining if the amount of resistance is above a threshold indicative of the first fuse 112 being blown. Low resistance may indicate that the first fuse 112 has not blown (i.e., the first temperature-sensitive element 120 has not undergone the change applicable to exposure to ambient thermal conditions exceeding the first threshold temperature). Conversely, high resistance would indicate that the first fuse 112 has blown. Thus, the testing step 317 provides an indicator of the most extreme thermal conditions (i.e., highest or lowest temperature) experienced by the printed circuit board assembly 102. In another embodiment, measuring resistance may include determining an amount of resistance and determining if the amount of resistance is above a threshold indicative of the first fuse 112 being blown.

In the alternative to measuring resistance, other measurements may be taken to determine whether the first fuse 112 has blown. For example, voltage may be applied across the first fuse 112 through the first and second test conductors 122, 124, and then an ammeter or other device may be used to measure current going through the first fuse 112. A blown fuse may not permit passage of an appreciable amount of current, so that if a small amount of current is measured through the first fuse 112, the first fuse 112 may be assumed to be blown. If a higher amount of current is measured, the first fuse 112 may be assumed to be not blown. Thus, the test module 180 may simply check for whether any current or signal made it through the first fuse 112. Those of skill in the art will recognize that there are many methods of checking the integrity of a circuit. Any such method may be used to test the solderable component 110 and/or the fuses 112, 114, and may also be used to read the identifier 116.

Figure 3B:
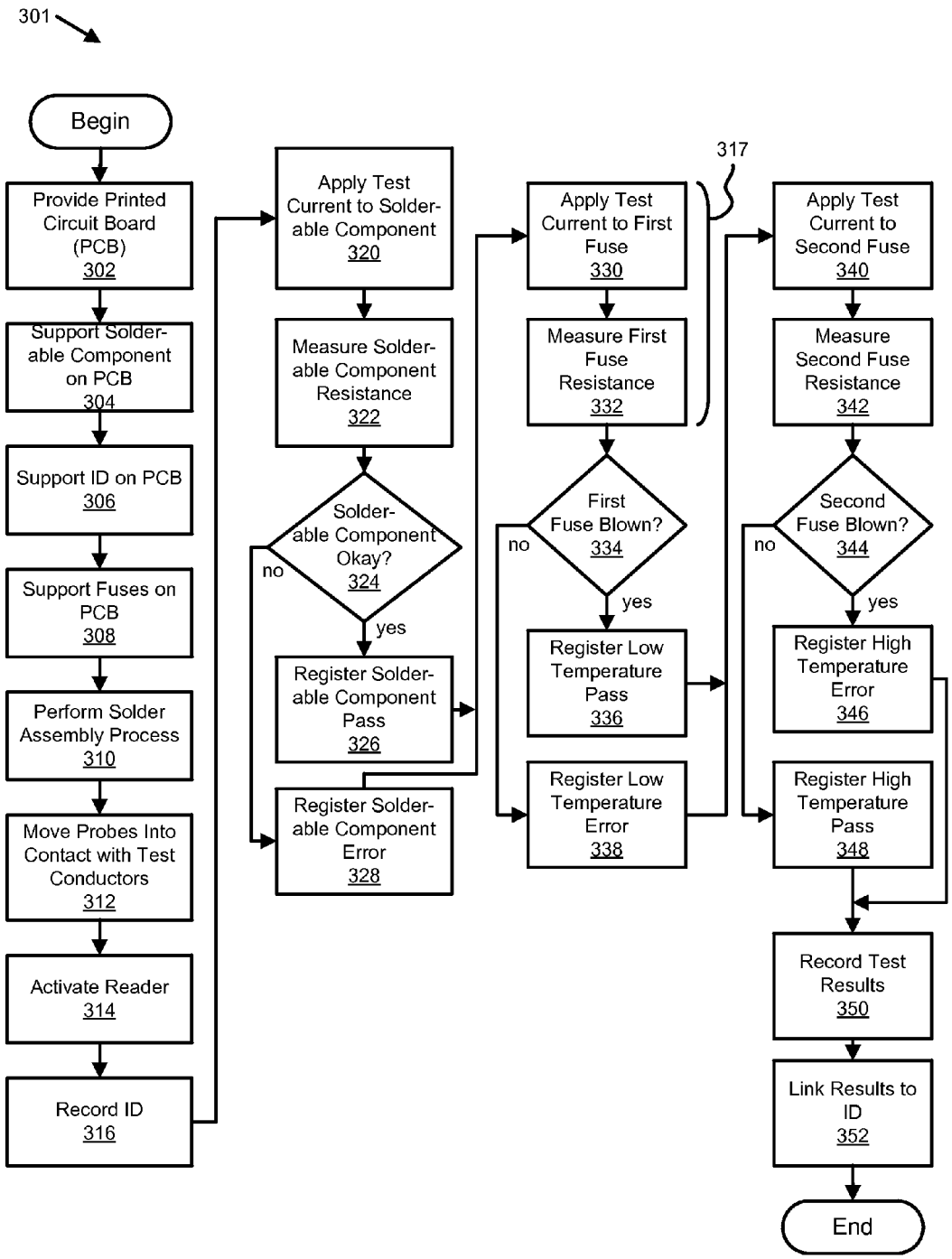
FIG. 3B is a schematic flow chart diagram illustrating an alternative method for assessing adherence of a manufacturing process to temperature specifications that may be used in conjunction with the system of FIG. 1 in accordance with the present invention.

FIG. 3B is a schematic flow chart diagram illustrating an alternative and more detailed method 301 for assessing adherence of a manufacturing process to temperature specifications that may be used in conjunction with the system 100 of FIG. 1 in accordance with the present invention. As shown, the steps 302, 304, 308, 310, 312, 317 may all be substantially as described above in the discussion of FIG. 3A. However, the method 301 of FIG. 3B may include several additional steps.

The method 301 includes supporting 306 the identifier 116 on the printed circuit board 108. This step 306 may be carried out after supporting 304 the solderable component 110 on the printed circuit board 108. However, the steps 304, 306, 308 may be performed in any order. The identifier 116 may be manufactured separately and secured to the printed circuit board 108, or may be formed on or in the printed circuit board 108. While the elements 110, 112, 114 may be precisely the same on every single printed circuit board assembly 102, each printed circuit board assembly 102 may include has a unique identifier 116. The identifier 116 may be uniquely formed on each printed circuit board assembly 102, or it may include non-volatile memory that is encoded with a unique set of data to provide an identifier 116 that is unique to each printed circuit board assembly 102.

Moving 312 the probes 164, 166 into contact with the test conductors 122, 124 may include moving the probes 164, 166, 168, 170, 172, 174 of the testing apparatus 104 into contact with the corresponding test conductors 122, 124, 132, 134, 140, 142. This may be accomplished through the use of a wide variety of mechanisms. The probes 164, 166, 168, 170, 172, 174 may all be coupled to one body so that they all move together, or may be divided into two or more groups that move independently of each other to reach the test conductors. Alternatively, the probes 164, 166, 168, 170, 172, 174 may remain stationary while the printed circuit board assembly 102 moves to put the test conductors 122, 124, 132, 134, 140, 142 into contact with the probes 164, 166, 168, 170, 172, 174.

Where an identifier 116 is included, once the identifier probes 172 are in contact with the identifier test conductors 140, the reader 162 may be activated 314 to read the identifier 116. According to one example, reading the identifier 116 may include applying a current or signal across the identifier test conductors 140 and measuring resistance or other signal aspects to receive the information (e.g., a serial number) stored in the identifier 116. Note that although FIG. 1 illustrates the presence of two identifier test conductors 140, there may be more than two. The same is also true for the other test conductors 122, 124, 132, 134, 142, and for the probes 164, 166, 168, 170, 172, 174.

Once the identifier 116 has been read, its information (e.g., the serial number) may be recorded 316, for example, in a data storage device (not shown) of the test module 180 or other data storage device accessible to the testing apparatus 104. The identifier 116 may also be displayed on a computer monitor or other display device so that a test operator can see which printed circuit board assembly 102 is being tested.

A printed circuit board assembly test current may then be applied 320 to the solderable component 110 via the printed circuit board assembly test conductors 142 and printed circuit board assembly probes 174 to test its operation. Aspects of the signal may be monitored to assess the operation of the solderable component 110, i.e., determine whether it has been properly formed, and hence, whether it is functioning properly. In one embodiment, the resistance encountered by the printed circuit board assembly test current is measured 322 to yield the necessary assessment.

If the solderable component 110 is okay 324 (i.e., functioning properly), the test module 180 may register 326 a "pass," indicating proper operation of the solderable component 110. This may include, for example, displaying that the solderable component 110 passed the test to a test operator on a computer monitor or other display device (not shown). In another example, registering 326 a "pass" may simply be recorded. Conversely, if the solderable component 110 is not okay 324 (i.e., not functioning properly), the test module 180 may register 328 a "fail" or an error to the test operator, indicating that the solderable component 110 failed the test. In one embodiment, registering 328 a "fail" may include notifying an operator, displaying a message, etc.

After the status of the solderable component 110 has been registered 326, 328, the first fuse 112 may be tested 317. In FIG. 3B, this step is broken down into steps 330 and 332. More specifically, a first test current may be applied 330 to the first fuse 112 via the first and second probes 164, 166 and the first and second test conductors 122, 124. The resistance of the first temperature-sensitive element 120 may be measured to determine whether the first fuse 112 has blown 334. The first threshold temperature may be related to a minimum temperature at which the solder assembly process is to be performed 310 according to the temperature profile selected by the process designers. For example, the first threshold may be set a little higher than the minimum temperature at which the solder assembly process is to be performed 310.

Accordingly, if the first fuse 112 has blown 334, the test module 180 may register 336 a "pass," indicating that the solder assembly process was performed 310 at a temperature greater than the desired minimum temperature. This may include, for example, displaying a "low temperature pass" to a test operator on a computer monitor or other display device. Conversely, if the first fuse 112 has not blown 334, the test module 180 may register 338 a "fail" or an error to the test operator, indicating that the solder assembly process was performed 310 at temperatures below the desired minimum temperature.

After the status of the first fuse 112 has been registered 336 or 338, a second test current may be applied 340 to the second fuse 114 via the third and fourth probes 168, 170 and the third and fourth test conductors 132, 134. The resistance of the second temperature-sensitive element 130 may be measured to determine whether the second fuse 114 has blown 344. The second threshold temperature may be related to a maximum temperature at which the solder assembly process is to be performed 310 according to the temperature profile selected by the process designers. For example, the second threshold may be set a little lower than the minimum temperature at which the solder assembly process is to be performed 310.

Accordingly, if the second fuse 114 has blown 344, the test module 180 may register 346 a "fail," or an error indicating that the solder assembly process was performed 310 at a temperature greater than a desired maximum temperature. This may include, for example, displaying a "high temperature fail" to a test operator. Conversely, if the second fuse 114 has not blown 344, the test module 180 may register 348 a "pass" to the test operator, indicating that the solder assembly process was performed 310 at temperatures below the desired maximum temperature.

After the solderable component 110, the first fuse 112, the second fuse 114, and the identifier 116 have been tested and/or read, the results of the tests and readings may be recorded 350, for example, in a data storage device (not shown) of the test module 180. "Recording ambient thermal conditions" need not entail recording exact temperatures; rather, such recording may simply involve recording whether or not a threshold temperature was exceeded. The test results may be linked 352 to the identifier 116 so that a user can look up the results of any particular printed circuit board assembly 102 to determine (a) whether the solderable component 110 of the printed circuit board assembly 102 passed its test, whether the solder assembly process was performed 310 at temperatures within the range of the established temperature profile.

Although the various steps of the method 301 are shown in a particular order, the order of the steps is purely exemplary. A variety of different sequences could be used. For example, activating 314 the reader 162 and applying 320, 330, 340 the test currents may be carried out in a number of different orders, along with the various reading and testing steps that occur in conjunction with those steps.

If desired, the method 301 could be appended to include steps to automate responses or corrections for problems discovered. For example, if the solderable component 110 on a printed circuit board assembly 102 is not okay 324, the test module 180 may cause the printed circuit board assembly 102 to be directed to a scrap area after the testing is complete. If the first fuse 112 is consistently not blown 334, the test module 180 may initiate adjustment of the heat source used to perform 310 the solder assembly process to increase the temperature. Conversely, if the second fuse 114 is consistently blown 344, the test module 180 may initiate adjustment of the heat source to decrease the temperature.

Since the printed circuit board assembly 102 has only the first and second fuses 112, 114, it is designed only to measure adherence to the minimum and maximum temperatures of the temperature profile. If desired, temperature readings may be taken within the temperature profile, in place of or in addition to temperature readings at the minimum and maximum temperatures of the temperature profile, to enable trends in the temperature to be analyzed before the solder assembly process occurs outside the temperature profile. Such an embodiment will be shown and described in connection with FIG. 4.

Figure 4:
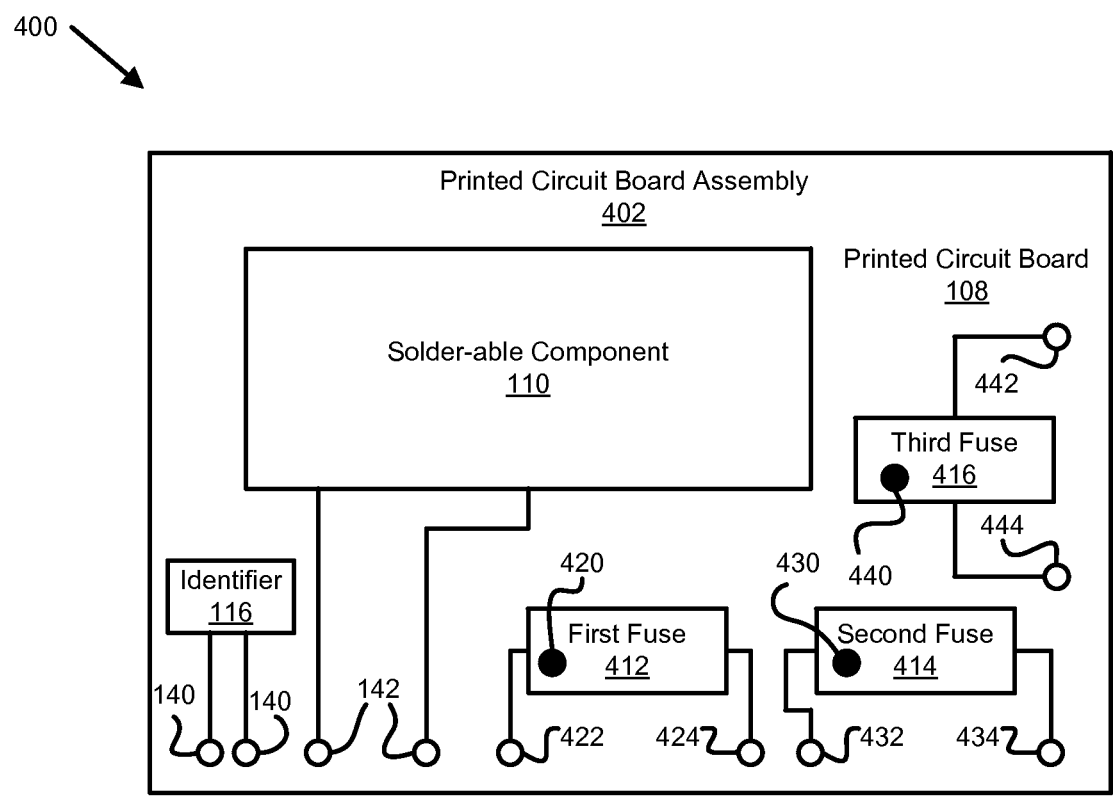
FIG. 4 is a schematic block diagram illustrating an apparatus in accordance with an alternative embodiment of the present invention.

FIG. 4 is a schematic block diagram illustrating an apparatus 400 in accordance with an alternative embodiment of the present invention. The apparatus 400 may take the form of a printed circuit board assembly 402, and may be used in conjunction with a testing apparatus 104 similar to that of the system 100 of FIG. 1. Like the printed circuit board assembly 102, the printed circuit board assembly 402 has a printed circuit board 108, a solderable component 110, and an identifier 116. However, in place of the first and second fuses 112, 114 of the printed circuit board assembly 102, the printed circuit board assembly 402 has a first fuse 412, a second fuse 414, and a third fuse 416.

The first fuse 412 has a first temperature-sensitive element 420, a first test conductor 422, and a second test conductor 424 connected as shown. The second fuse 414 has a second temperature-sensitive element 430, a third test conductor 432, and a fourth test conductor 434 connected as shown. The third fuse 416 has a third temperature-sensitive element 440, a fifth test conductor 442, and a sixth test conductor 444 connected as shown.

The first, second, and third fuses 412, 414, 416, in one embodiment, may not be designed to blow at the minimum and/or maximum temperatures of a temperature profile. Rather, they may be designed to blow at temperatures between the maximum and minimum temperatures to provide advanced warning of improper temperature trending. Thus, the first temperature-sensitive element 420 may be designed such that the first fuse 412 blows at a first threshold temperature. The second temperature-sensitive element 430 may be designed such that the second fuse 414 blows at a second threshold temperature that is spaced apart from the first threshold temperature by a temperature increment. This temperature increment may be, for example, one degree, three degrees, five degrees, ten degrees, twenty degrees, fifty degrees, or a hundred degrees, Fahrenheit or Centigrade. The second threshold temperature may be higher than the first threshold temperature. The third temperature-sensitive element 440 may be designed such that the third fuse 416 blows at a third threshold temperature that is higher than the second threshold temperature and spaced apart from the second threshold temperature by the same temperature increment.

In another embodiment the first fuse 412 may include a first temperature threshold that is related to the minimum desirable temperature of the soldering process. For example, the first temperature threshold may be at or a little above or below the minimum temperature. In another embodiment, the third fuse 416 includes a third temperature threshold related to the maximum temperature desired for the soldering process, for example, at or a little above or below the maximum temperature. In another embodiment, the first temperature threshold is related to the minimum temperature and the third temperature threshold related to the maximum temperature.

Figure 5:
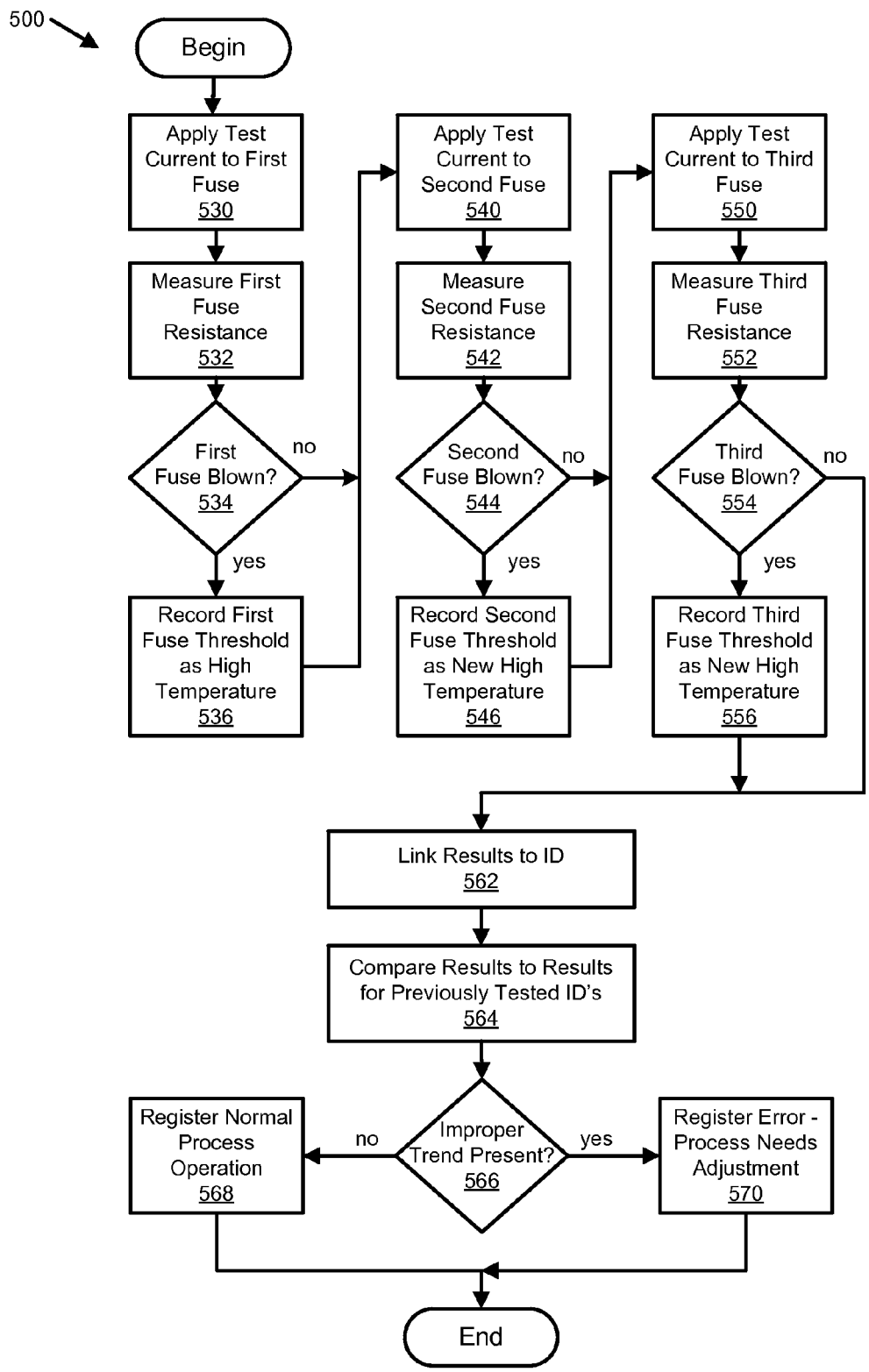
FIG. 5 is a schematic flow chart diagram illustrating one embodiment of a method for assessing and recording adherence of a manufacturing process to temperature specifications that may be used in conjunction with the apparatus of FIG. 4 in accordance with the present invention.

FIG. 5 is a schematic flow chart diagram illustrating one embodiment of a method 500 for assessing and recording adherence of a manufacturing process to temperature specifications that may be used in conjunction with the apparatus 400 of FIG. 4 in accordance with the present invention. The method 500 may commence with steps like the steps 302, 304, 306, 308, 310, 312, 314, 317 like those illustrated in FIG. 3B. These have been omitted from FIG. 5 for simplicity. After performance of these steps, a first test current may be applied 530 to the first fuse 412. The resistance of the first fuse 412 may be measured 532 to determine whether the first fuse 412 has blown 534. If the first fuse 412 has blown 534, the first threshold temperature is recorded 536 as the highest temperature experienced by the solderable component 110. If the first fuse 412 has not blown 534, there is no need to record a new highest temperature.

Next, a second test current may be applied 540 to the second fuse 414. The resistance of the second fuse 414 may be measured 542 to determine whether the second fuse 414 has blown 544. If the second fuse 414 has blown 544, the second threshold temperature is recorded 546 as the highest temperature experienced by the solderable component 110. If the second fuse 414 has not blown 544, there is no need to record a new highest temperature.

Next, a third test current may be applied 550 to the third fuse 416. The resistance of the third fuse 416 may be measured 552 to determine whether the third fuse 416 has blown 554. If the third fuse 416 has blown 554, the third threshold temperature is recorded 556 as the highest temperature experienced by the solderable component 110. If the third fuse 416 has not blown 554, there is no need to record a new highest temperature.

The highest temperature recorded in any of steps 536, 546, 556, as applicable, may then be linked 562 to the identifier 116 for the printed circuit board assembly 402. Hence, a record exists of the maximum ambient temperature experienced by the printed circuit board assembly 402, with a margin of error proportional to the size of the temperature increment. This maximum temperature may be compared 564 with other test data, such as the maximum temperatures experienced by other printed circuit board assemblies 402 that were made and tested previously. Analysis of temperature trends may be carried out to determine 566 whether an improper trend is present, e.g., the temperature of the solder assembly process is drifting and may soon depart from the desired temperature profile. Statistical process control or other methods may be used to analyze the temperature data for patterns. Such analysis may be automated by a computing device, or may be performed manually by the test operator or other individual. FIG. 5 assumes the analysis is automated. If an improper trend is not present 566, the test module 180 may register 568 normal process operation. If an improper trend is present 566, the test module 180 may register an error 570 and/or otherwise indicate that the solder assembly process is in need of temperature adjustment. As with previous embodiments, the necessary corrective steps may be automated if desired.

For example, if a first printed circuit board assembly 402 is tested and no fuses have blown, then a second printed circuit board assembly 402 produced after the first is tested and the first fuse 412 has blown, then a third printed circuit board assembly 402 produced after the second is tested and the first and second fuses 412, 414 have blown, and then a fourth printed circuit board assembly 402 produced after the third is tested and the first, second, and third fuses 412, 414, 416 have all blown, this may indicate that the temperature of the solder assembly process is drifting upward, and may soon exceed the maximum temperature of the temperature profile. Thus, corrective action can be taken before the temperature of the solder assembly process leaves the temperature profile.

The printed circuit board assembly 402 has three fuses 412, 414, 416, any number of fuses may be provided. If desired, the threshold temperatures of all fuses may be selected to provide an array where, when ordered from lowest to highest, adjacent threshold temperatures are always spaced apart by the same temperature increment. The more fuses there are, the more granular the temperature data will be. If desired, the fuses may all be positioned close together on the printed circuit board assembly 402 so as to provide the most accurate possible measurement of the maximum temperature experienced by that portion of the printed circuit board assembly 402. Alternatively, the fuses may be arranged at different locations on a circuit board to enable independent measurement of the temperatures experienced by various portions of the circuit board. Such an embodiment will be shown and described in connection with FIG. 6.

Figure 6:
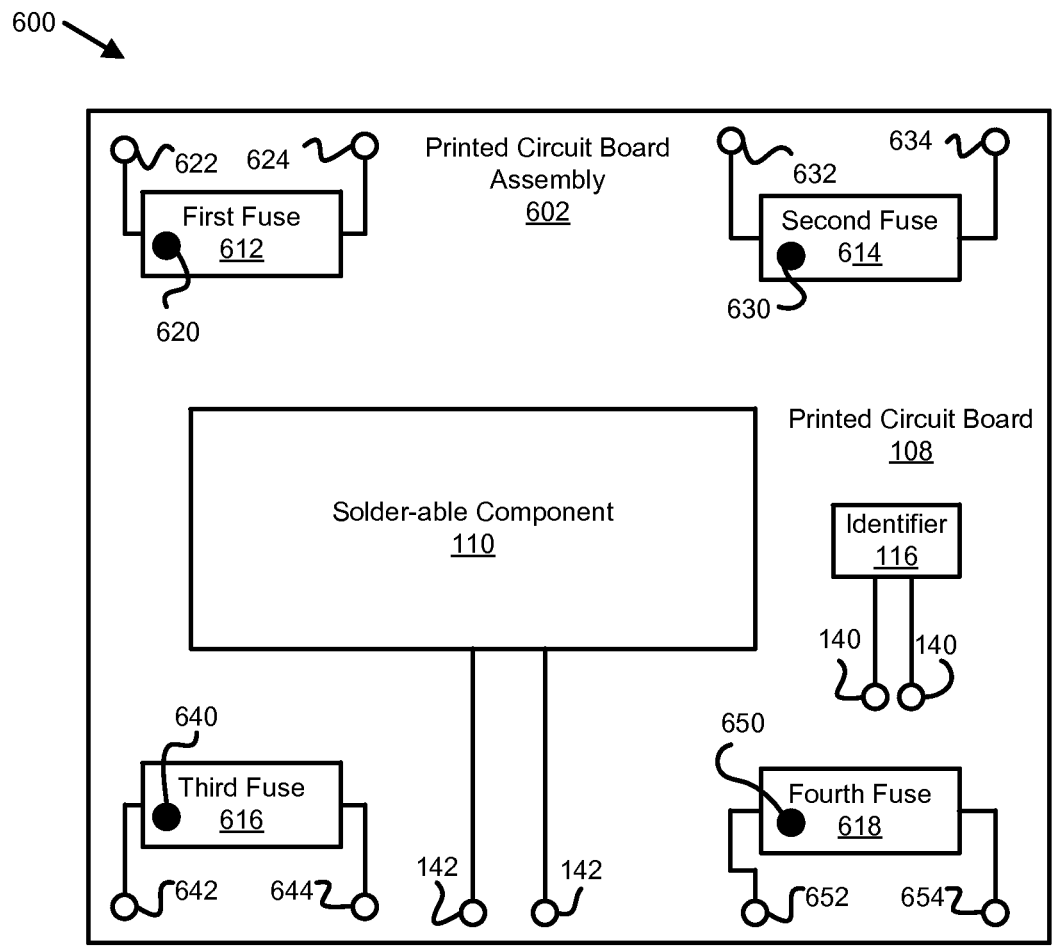
FIG. 6 is a schematic block diagram illustrating an apparatus in accordance with another alternative embodiment of the present invention.

FIG. 6 is a schematic block diagram illustrating an apparatus 600 in accordance with another alternative embodiment of the present invention Like the printed circuit board assembly 102 of FIG. 1 and the apparatus 400 of FIG. 4, the apparatus 600 may take the form of a printed circuit board assembly 602, and may be used in conjunction with a testing apparatus 104 similar to that of the system 100 of FIG. 1. The apparatus 600 may be a printed circuit board assembly 602 and may include a printed circuit board 108, a solderable component 110, and an identifier 616.

Additionally, the printed circuit board assembly 602 has a first fuse 612, a second fuse 614, a third fuse 616, and a fourth fuse 618. The first fuse 612 may have a first temperature-sensitive element 620 that measurably changes in response to exposure to ambient thermal conditions exceeding a first threshold temperature, a first test conductor 622, and a second test conductor 624 connected as shown. The second fuse 614 may have a second temperature-sensitive element 630 that measurably changes in response to exposure to ambient thermal conditions exceeding a second threshold temperature, a third test conductor 632, and a fourth test conductor 634 connected as shown. The third fuse 616 may have a third temperature-sensitive element 640 that measurably changes in response to exposure to ambient thermal conditions exceeding a third threshold temperature, a fifth test conductor 642, and a sixth test conductor 644 connected as shown. The fourth fuse 618 may have a fourth temperature-sensitive element 650 that measurably changes in response to exposure to ambient thermal conditions exceeding a fourth threshold temperature, a seventh test conductor 652, and an eighth test conductor 654 connected as shown.

As shown in FIG. 6, the fuses 612, 614, 616, 618 are positioned at the four corners of the printed circuit board 108. Thus, they enable recordation of the maximum temperature experienced by each of four portions of the printed circuit board assembly 602. The temperature profile for the solder assembly process may involve minimum and/or maximum temperatures that are different for various portions of the printed circuit board assembly 602. This is because some structures to be processed in the course of solder assembly may require higher temperatures than others. Accordingly, the first, second, third, and fourth threshold temperatures may all be different.

Even if the desired temperature profile is the same for all portions of the printed circuit board assembly 602, it may be desirable to have multiple fuses that blow at the same temperature to enable measurement of undesired thermal gradients provided by the heat source. Multiple fuses may be provided at each location on the printed circuit board assembly 602 to enable measurement of adherence to minimum and maximum temperatures of the temperature profile for each location on the printed circuit board assembly 602, or measurement of thermal trends at each location on the printed circuit board assembly 602.

As mentioned, one or more embodiments may be used to monitor the temperature provided by solder assembly process. Such a process may be designed to operate at temperatures ranging, for example, from 100° C. to 400° C., or more specifically, at temperatures ranging from 150° C. to 250° C. More specifically, such a process may be designed to operate at temperatures ranging from 200° C. to 300° C., or yet more precisely, at temperatures ranging from 225° C. to 275° C. In the alternative, the present invention need not be used for a solder assembly process, but may be used for another process such as the storage and/or transport of printed circuit board assemblies. If desired, much lower temperature thresholds may be used for fuses to provide an indication of whether the storage and/or transport of the printed circuit board assemblies reached temperatures either above or below the desirable limits.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
providing a printed circuit board;
supporting a solderable component on the printed circuit board;
supporting a first fuse and a second fuse on the printed circuit board, wherein the first fuse comprises a first temperature-sensitive element that measurably changes electrical resistance in response to exposure of the first fuse to ambient thermal conditions exceeding a first threshold temperature and wherein the second fuse comprises a second temperature-sensitive element that measurably changes electrical resistance in response to exposure of the second fuse to ambient thermal conditions exceeding a second threshold temperature such that the printed circuit board, the solderable component, and the first fuse define an apparatus, the printed circuit board, the solderable component, the first fuse and the second fuse comprise a printed circuit board assembly;
performing a printed circuit board assembly manufacturing process on the apparatus; and
testing the first fuse after termination of the printed circuit board assembly manufacturing process to determine whether, during the printed circuit board assembly manufacturing process, the first fuse was exposed to ambient thermal conditions exceeding the first threshold temperature;
testing the second fuse after termination of the printed circuit board assembly manufacturing process to determine whether, during the printed circuit board assembly manufacturing process, the second fuse was exposed to ambient thermal conditions exceeding the second threshold temperature;
wherein the first threshold temperature comprises a minimum temperature at which the printed circuit board assembly manufacturing process used to manufacture the printed circuit board assembly is to be carried out and the second threshold temperature comprises a maximum temperature at which the printed circuit board assembly manufacturing process is to occur, the minimum temperature and the maximum temperature are related to temperature specifications of the printed circuit board assembly manufacturing process.

2. The method of claim 1, wherein the first fuse comprises a first test conductor connected to the first fuse and a second test conductor connected to the first fuse and the printed circuit board assembly comprises a plurality of printed circuit board assembly test conductors, wherein a resistance of the first temperature-sensitive element measurably changes in response to exposure of the first fuse to ambient thermal conditions exceeding the first threshold temperature, the method further comprising:
contacting the first and second test conductors and the printed circuit board assembly test conductors with probes of an in-circuit tester;
measuring resistance of the first fuse by way of the first and second test conductors; and
assessing operation of the printed circuit board assembly through the printed circuit board assembly test conductors.

3. The method of claim 1, wherein performing the printed circuit board assembly manufacturing process comprises performing a solder assembly process on the printed circuit board assembly.

4. The method of claim 1, wherein the apparatus further comprises a third fuse supported by the printed circuit board, the method further comprising:
testing the third fuse after termination of the printed circuit board assembly manufacturing process to determine whether, during the printed circuit board assembly manufacturing process, the third fuse was exposed to ambient thermal conditions exceeding a third threshold temperature, wherein the third threshold temperatures is between the first threshold temperature and the second threshold temperature.

5. The method of claim 1, wherein the first fuse and the second fuse are surface mounted to the printed circuit board.

6. The method of claim 2, wherein the second fuse comprises a third test conductor connected to the second fuse and a fourth test conductor connected to the second fuse and the printed circuit board assembly comprises a plurality of printed circuit board assembly test conductors, wherein a resistance of the second temperature-sensitive element measurably changes in response to exposure of the second fuse to ambient thermal conditions exceeding the second threshold temperature, the method further comprising:
- contacting the third and fourth test conductors and the printed circuit board assembly test conductors with probes of an in-circuit tester;
- measuring resistance of the second fuse by way of the third and fourth test conductors; and
- assessing operation of the printed circuit board assembly through the printed circuit board assembly test conductors.

* * * * *